(12) United States Patent
Nitta et al.

(10) Patent No.: US 8,476,902 B2
(45) Date of Patent: Jul. 2, 2013

(54) MAGNETIC RESONANCE IMAGING APPARATUS

(75) Inventors: Shuhei Nitta, Kawasaki (JP); Masahide Nishiura, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 502 days.

(21) Appl. No.: 12/891,165

(22) Filed: Sep. 27, 2010

(65) Prior Publication Data

US 2011/0234226 A1    Sep. 29, 2011

(30) Foreign Application Priority Data

Mar. 26, 2010  (JP) ................................ 2010-073704

(51) Int. Cl.
*G01V 3/00*  (2006.01)
(52) U.S. Cl.
USPC ......................................................... 324/307
(58) Field of Classification Search
USPC ........................... 324/322–300; 600/407–445
See application file for complete search history.

(56) References Cited

U.S. PATENT DOCUMENTS

| 5,774,357 | A | * | 6/1998 | Hoffberg et al. | ............... | 713/600 |
| 5,920,477 | A | * | 7/1999 | Hoffberg et al. | ............... | 382/181 |
| 7,225,012 | B1 | * | 5/2007 | Susil et al. | .................... | 600/414 |
| 7,805,182 | B2 | * | 9/2010 | Weese et al. | ................... | 600/424 |
| 8,191,359 | B2 | * | 6/2012 | White et al. | ..................... | 60/407 |
| 2011/0295109 | A1 | * | 12/2011 | Lavallee et al. | ............... | 600/424 |
| 2012/0035462 | A1 | * | 2/2012 | Maurer et al. | ................ | 600/411 |

FOREIGN PATENT DOCUMENTS

JP    2002-28150    1/2002

* cited by examiner

*Primary Examiner* — Brij Shrivastav
(74) *Attorney, Agent, or Firm* — Oblon, Spivak, McClelland, Maier & Neustadt, L.L.P.

(57) ABSTRACT

According to one embodiment, a magnetic resonance imaging apparatus is provided. A first imaging unit captures a plurality of first image data including first and second reference frames. The frames include a reference position and a target region in an object. A movement amount calculation unit calculates a movement amount of a local position between the first and second reference frames. A correction parameter setting unit sets a first correction parameter for correcting body motion of the object, based on the movement amount. An error map generating unit generates a predictive error map including a pixel value corresponding to a predictive correction error. The predictive correction error is obtained from a predictive position based on the movement amount and a predictive correction position based on the first correction parameter. A display unit displays the predictive error map and the first image data.

8 Claims, 10 Drawing Sheets

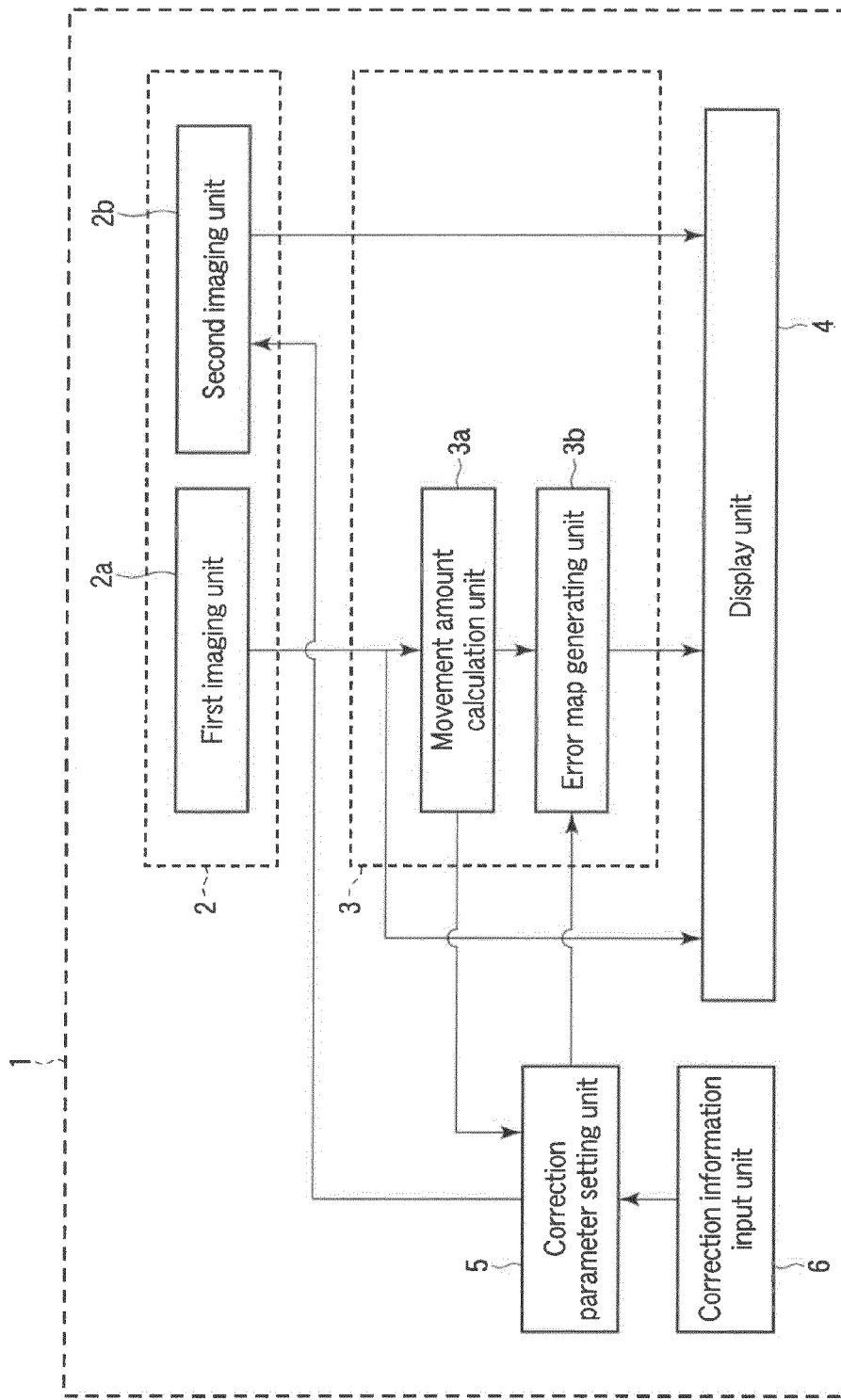
F I G. 2

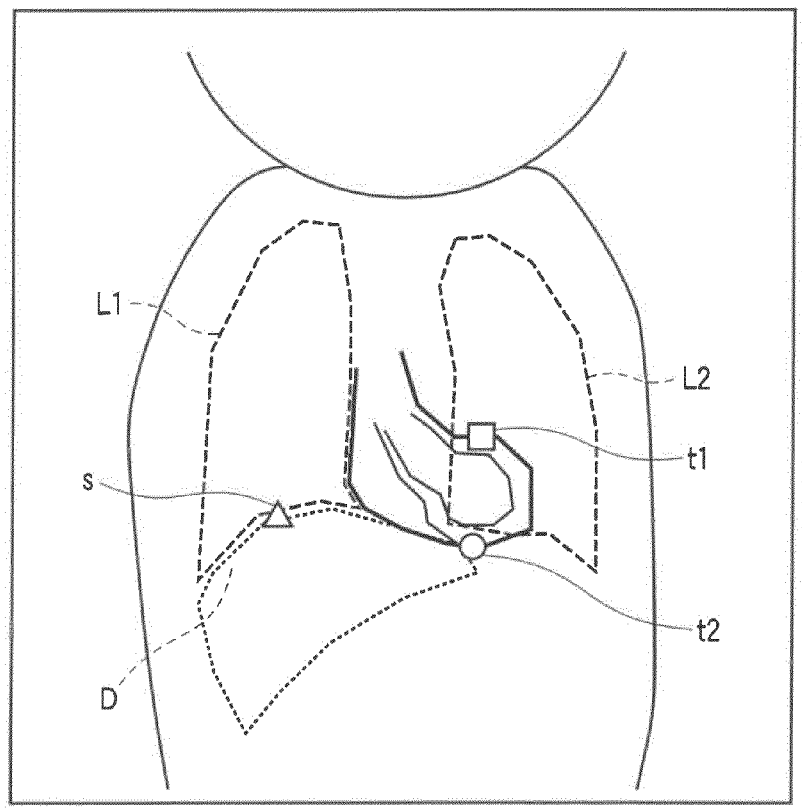
F I G. 8
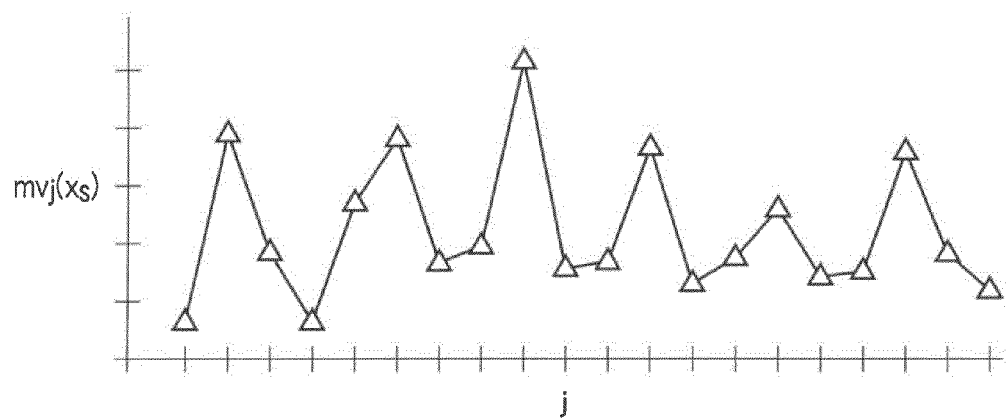
F I G. 9A

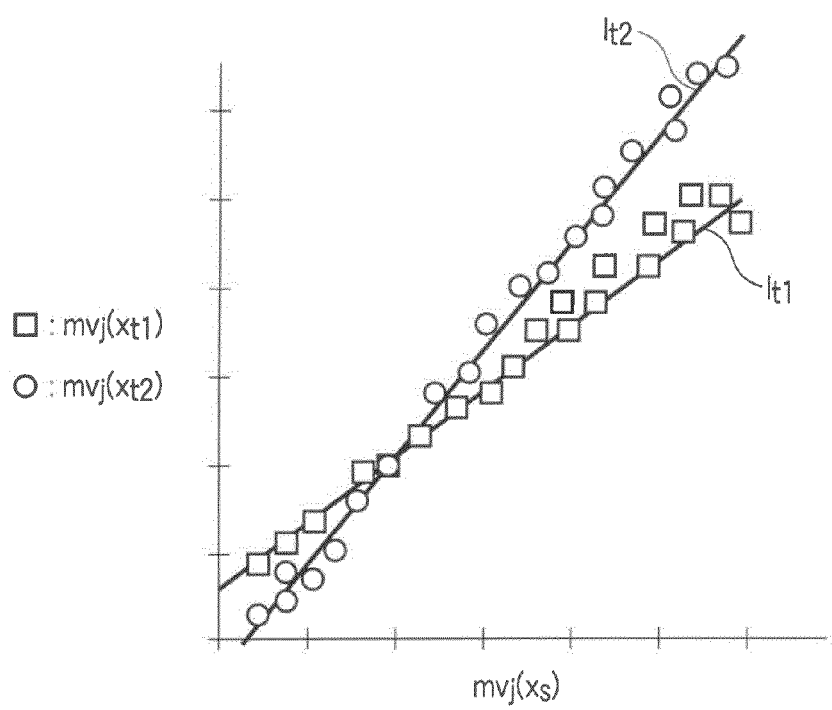
F I G. 10
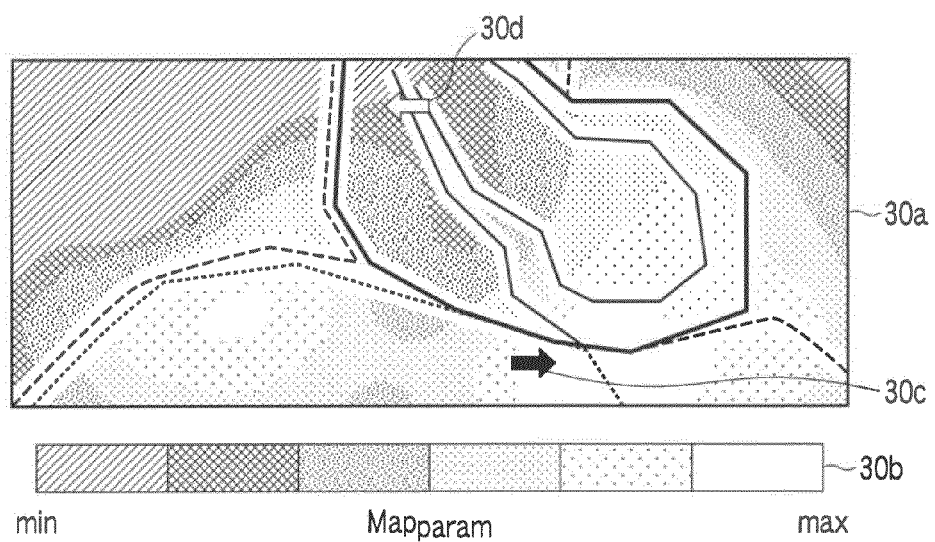
F I G. 11

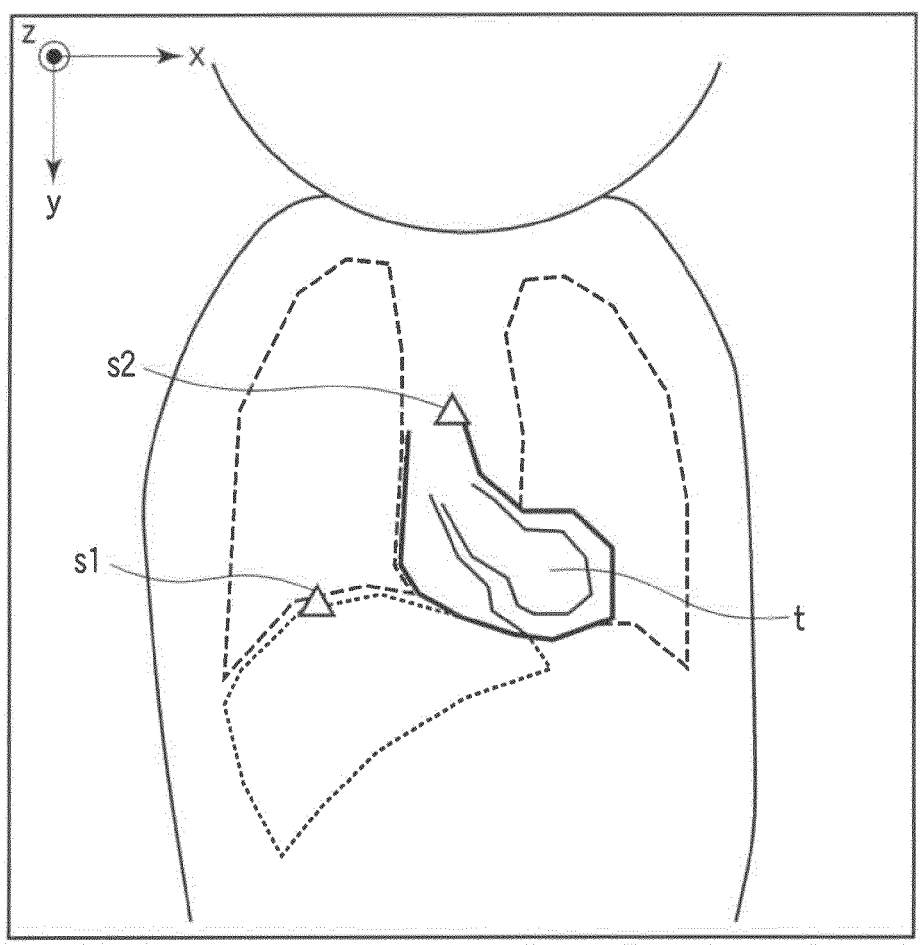
F I G. 12

MAGNETIC RESONANCE IMAGING APPARATUS

CROSS-REFERENCE TO RELATED APPLICATIONS

This application is based upon and claims the benefit of priority from Japanese Patent Application No. 2010-073704, filed Mar. 26, 2010; the entire contents of which are incorporated herein by reference.

FIELD

Embodiments described herein relate generally to a magnetic resonance imaging apparatus which images a desired imaging target upon correcting the body motion of the imaging target.

BACKGROUND

A magnetic resonance imaging apparatus requires a longer time for imaging than an X-ray CT apparatus and an ultrasonic apparatus, and hence tends to generate artifacts when imaging an object which moves due to body motion.

When, for example, the heart which moves due to respiration is an imaging target, it is known that the motion of the heart due to respiration is proportional to the motion of the diaphragm. There is therefore available a method of monitoring the motion of the diaphragm due to respiration by using navigator pulses upon setting the diaphragm as a reference position, and correcting the motion of the heart due to respiration by correcting the position where an MR signal is acquired, based on the position of the diaphragm, using transform such as translation. There is available another method which stores an acquired MR signal and the position information of the diaphragm at the time of the acquisition as a combination in advance, and reconstructs image data after correcting the acquired MR signal based on the position information of the diaphragm. These methods can capture an MR image (second image data) with little motion artifact.

The relationship between the motion of the diaphragm and the motion of the heart differs for each object. Calculating a transform parameter for correction (body motion correction parameter) for each object will improve the accuracy of motion correction.

A conventional magnetic resonance imaging apparatus captures an MR image (first image data) for monitoring a reference position and the body motion of an imaging target. The apparatus automatically calculates a body motion correction parameter for each object from the first image data. The apparatus captures the second image data by using the calculated body motion correction parameter (e.g. JP-A 2002-28150 (KOKAI)).

An imaging target such as the heart has more complex motion due to body motion, and may change its shape and position even if a reference position remains the same. For this reason, even when a body motion correction parameter is calculated for each object and the body motion of the imaging target is corrected by translation or transform with higher order than translation, correction errors occur. The errors differ in amount at each position on the imaging target.

The conventional magnetic resonance imaging apparatus cannot check to which degree body motion can be corrected at each position on an imaging target by a set body motion correction parameter.

BRIEF DESCRIPTION OF THE DRAWINGS

FIG. 2 is a block diagram of a magnetic resonance imaging apparatus according to the first embodiment;
FIG. 8 is a schematic view of a magnetic resonance image;
FIG. 9A is a graph showing changes in the movement amount of a reference position;
FIG. 10 is a graph representing the relationship between the movement of a reference position and the movements of target positions;
FIG. 11 is a view showing an example of a composite image of the second correction parameter map and first image data;
and
FIG. 12 is a schematic view of a magnetic resonance image.

DETAILED DESCRIPTION

In general, according to one embodiment, a magnetic resonance imaging apparatus may be provided. A first imaging unit may capture a plurality of first image data including first and second reference frames. The frames may include a reference position and a target region in an object. A movement amount calculation unit may calculate a movement amount of a local position between the first and second reference frames. A correction parameter setting unit may set a first correction parameter for correcting body motion of the object, based on the movement amount. An error map generating unit may generate a predictive error map including a pixel value corresponding to a predictive correction error. The predictive correction error may be obtained from a predictive position based on the movement amount and a predictive correction position based on the first correction parameter. A display unit may display the predictive error map and the first image data.

Embodiments will be described below with reference to the views of the accompanying drawing.

First Embodiment

Figure 1:
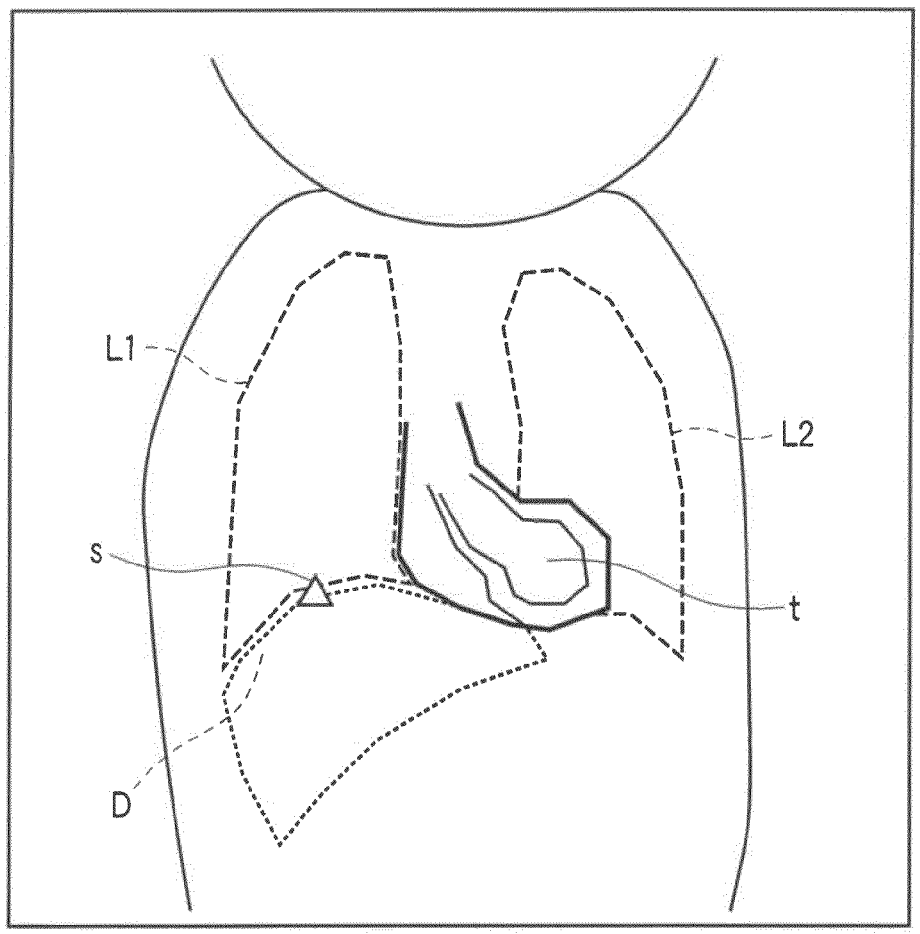
FIG. 1 is a schematic view of a magnetic resonance image.

A magnetic resonance imaging apparatus 1 according to the first embodiment will be described with reference to FIGS. 1, 2, 3, 4, 5A, AND 5B. FIG. 1 is a schematic view of a magnetic resonance image associated with a human chest region. FIG. 1 shows an imaging target t and a reference position s in this embodiment. The imaging target t is the heart. The reference position s is a point on a diaphragm D below a right lung L1. The magnetic resonance imaging apparatus 1 of this embodiment captures image data (second image data) corrected by correcting the motion of the heart due to respiration. In the following description, assume that the heart moves parallel to the body axis direction in proportion to the motion of the diaphragm D in the body axis direction. The following is a case in which the motion of the heart is corrected by translating an imaging position in the body axis direction. For example, the relationship between a movement amount $d_s$ of the diaphragm D in the body axis direction and a correction amount $d_c$ of the imaging position in the body axis direction is represented by equation (1).

$$d_c = a \cdot d_s \quad (1)$$

A coefficient a in equation (1) is a body motion correction parameter representing the relationship between the motion of the diaphragm D and the motion of the heart. Since the relationship between the motion of the diaphragm and the motion of the heart differs for each object, calculating a body motion correction parameter for each object allows more accurate motion correction.

To calculate a body motion correction parameter which differs for each object, this apparatus captures a plurality of image data (first image data) including images of the diaphragm and heart before capturing the second image data.

The magnetic resonance imaging apparatus 1 of this embodiment obtains a body motion correction parameter (first correction parameter) from the first image data, and predicts with how much error motion correction can be performed at each position on the heart as an imaging target by correction using the body motion correction parameter. The magnetic resonance imaging apparatus 1 of the embodiment visualizes predicted error and presents the visualized error to the user.

FIG. 2 is a block diagram of the magnetic resonance imaging apparatus 1 of this embodiment. The magnetic resonance imaging apparatus 1 includes an imaging unit 2, a processing unit 3, a display unit 4, a correction parameter setting unit 5, and a correction information input unit 6.

The imaging unit 2 includes a first imaging unit 2a and a second imaging unit 2b. The first imaging unit 2a acquires the first image data as a plurality of image data including a reference position on the object and an imaging target. The second imaging unit 2b monitors the movement of a reference position using navigator pulses and acquires the second image data as image data obtained by correcting the motion of an imaging target based on the movement of the reference position. The first image data obtained by the first imaging unit 2a are input to a movement amount calculation unit 3a and the display unit 4. The second image data obtained by the second imaging unit 2b is input to the display unit 4.

The processing unit 3 includes the movement amount calculation unit 3a and an error map generating unit 3b.

The movement amount calculation unit 3a calculates movement amounts from a plurality of local positions (to be referred to as "target positions" hereinafter) including a reference position on the first reference frame and a target region in the first image data to the second reference frame. The calculated movement amounts are input to the error map generating unit 3b and the correction parameter setting unit 5.

The error map generating unit 3b calculates a predictive correction position for each target position based on the movement amount of the reference position and the body motion correction parameter. The error map generating unit 3b obtains a target position from the movement amount of each target position. The error map generating unit 3b calculates a predictive correction error which is an error between the predictive correction position and the obtained position. The error map generating unit 3b generates a predictive error map having predictive correction errors as pixel values. The generated predictive error map is input to the display unit 4. When a body motion correction parameter is corrected, the error map generating unit 3b updates the predictive error map. The updated predictive error map is input to the display unit 4.

The display unit 4 is a display such as a liquid crystal display device or CRT.

The correction parameter setting unit 5 sets a body motion correction parameter necessary for capturing the second image data and the calculation of a predictive correction error. For example, the correction parameter setting unit 5 may set a fixed value as a body motion correction parameter regardless of an object or calculate a body motion correction parameter for each object based on the movement amount calculated by the movement amount calculation unit 3a, as will be described later. The set body motion correction parameter is input to the error map generating unit 3b and the second imaging unit 2b.

The correction information input unit 6 is a unit which inputs correction information for a body motion correction parameter. For example, the correction information input unit 6 is implemented by user interfaces such as a mouse, keyboard, trackball, and touch panel. The corrected body motion correction parameter is input to the correction parameter setting unit 5.

Figure 3:
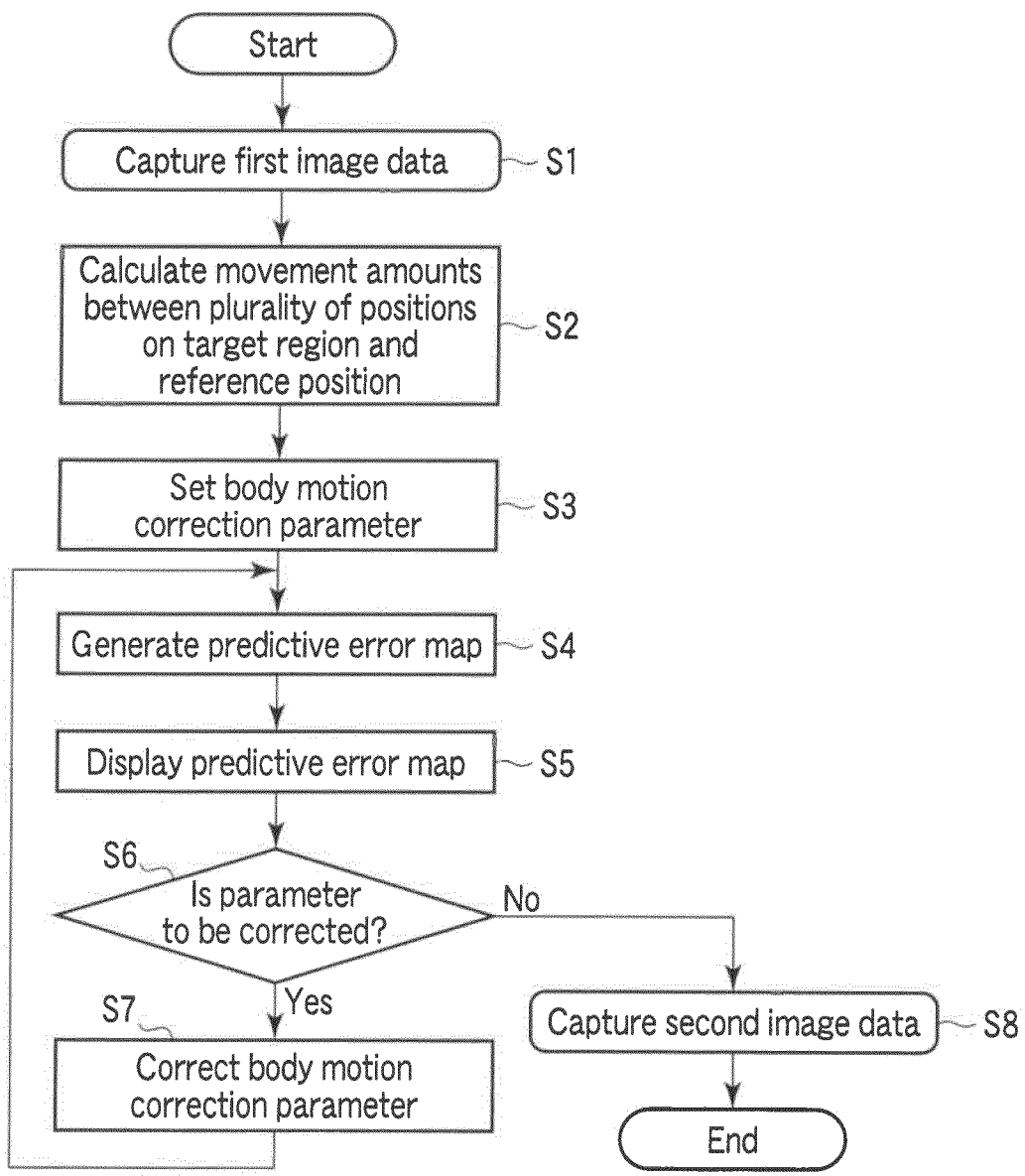
FIG. 3 is a flowchart for the magnetic resonance imaging apparatus according to the first embodiment.

FIG. 3 is a flowchart showing the operation of the magnetic resonance imaging apparatus 1 according to this embodiment.

In step S1, the first imaging unit 2a captures the first image data as a plurality of image data including a reference position on an object and an imaging target, and outputs the data to the movement amount calculation unit 3a.

In step S2, the movement amount calculation unit 3a calculates movement amounts from a reference position on the first reference frame to the second reference frames at target positions in the first image data.

In this embodiment, the first reference frame is one arbitrary image data of the first image data, and the second reference frames are the remaining first image data. If N first image data exist, N−1 second reference frames exist. That is, the movement amount calculation unit 3a calculates N−1 movement amounts between the reference position and the respective target positions. Note however that the manner of selecting the first and second reference frames is not limited to this. It is possible to select all possible combinations of first and second reference frames from the first image data as long as one or more movement amounts can be calculated for each combination of reference and target positions.

In addition, movement amounts may be calculated by preparing a template having a reference position on the first reference frame and target positions as central positions and performing matching with the second reference frames. Alternatively, it is possible to calculate movement amounts between a reference position and the respective target positions by deforming the first reference frame or the second reference frames such that the luminance pattern of the first reference frame matches that of each second reference frame.

In addition, "target positions" may be all the points on the first reference frame or may be points sampled at equal intervals. A set of points on a boundary of an imaging target on the first reference frame may be used as target positions.

In step S3, the correction parameter setting unit 5 sets a body motion correction parameter. In this embodiment, a "body motion correction parameter" is a proportionality constant representing the relationship between the movement amount of a reference position and the correction amount of an imaging position, and is the parameter a in equation (1).

The correction parameter setting unit 5 of this embodiment calculates a body motion correction parameter for each object, which minimizes a predictive correction error (to be described in step S4) at an arbitrary target position $x_t$. A predictive correction error will be described later. A method of calculating a body motion correction parameter will be described in detail in step S14 in the second embodiment. A body motion correction parameter setting method to be used is not limited to this method. For example, a fixed value such as 1.0 or 0.0 may be set regardless of objects.

In step S4, the error map generating unit 3b obtains a predictive correction position for each target position based on the movement amount of the reference position and the body motion correction parameter. The error map generating unit 3b obtains a position for each target position from the movement amount calculated for each target position by the movement amount calculation unit 3a. The error map generating unit 3b calculates a predictive correction error as an error between the obtained position and the predictive correction position. The error map generating unit 3b generates a predictive error map. The predictive error map is an image having predictive correction errors as pixel values. A predictive correction error $MAP_{err}(x_t)$ for each target position $x_t$ is obtained by, for example, equation (2).

$$MAP_{err}(x_t) = \sum_{j=1}^{N-1} (d'_{c,j} - mv_j(x_t))^2 \qquad (2)$$
$$= \sum_{j=1}^{N-1} (a \cdot mv_j(x_s) - mv_j(x_t))^2$$

A movement amount $mv_j(x_t)$ is the movement amount of the target position $x_t$. The movement amount $mv_j(x_t)$ is calculated from the first reference frame and the jth second reference frame of the N−1 second reference frames. A movement amount $mv_j(x_s)$ is the movement amount of a reference position $x_s$. A predictive correction amount $d'_{c,j}$ is calculated from the movement amount $mv_j(x_t)$ of the target position $x_t$ and the body motion correction parameter a. As described above, in this embodiment, an imaging target is corrected only in the body axis direction. The movement amount of a target position, the movement amount of a reference position, and a predictive correction amount all indicate scalar values in the body axis direction. A predictive correction error is not limited to the total sum of square errors indicated by equation (2). For example, a predictive correction error may be the total sum of absolute value errors or the like as long as it is an index indicating the difference between a predictive correction position and a movement amount for each target position.

A predictive error map is an image having the predictive correction errors calculated by equation (2) as pixel values. A predictive correction error at a target position can be calculated. It is possible to add, as pixels of a predictive error map, predictive correction errors calculated by interpolation based on the values and positions of the calculated predictive correction errors.

In step S5, the display unit 4 displays the predictive error map generated by the error map generating unit 3b.

Figure 4:
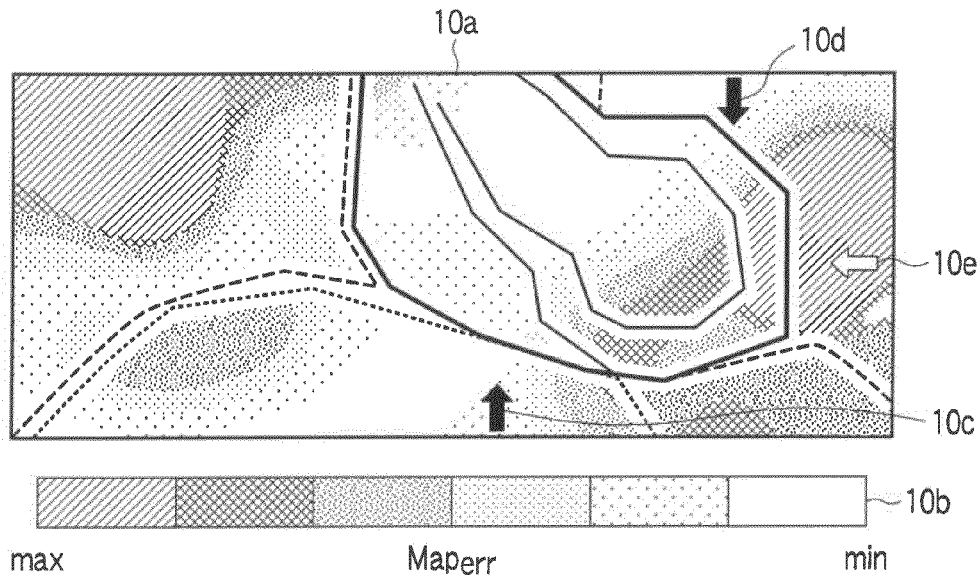
FIG. 4 is a view showing a display example of a prediction error map and first image data.
Figure 5A:
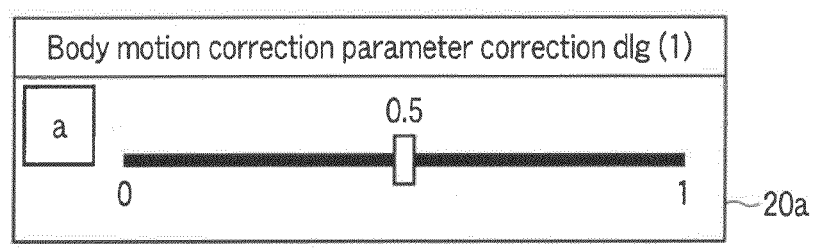
FIG. 5A is a view of a GUI.
Figure 5B:
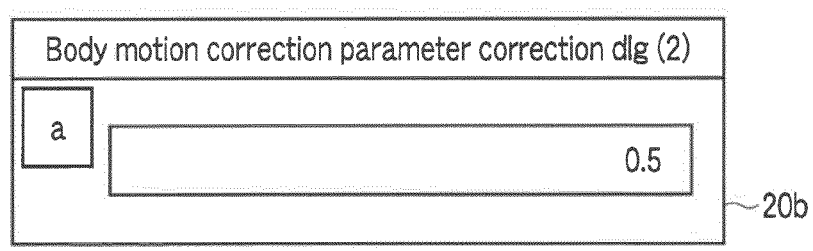
FIG. 5B is a view of a GUI.

FIG. 4 shows an example of a display window of a predictive error map and first image data. An image 10a is a composite image of the predictive error map and first image data. As the respective pixel values of the image 10a, values corresponding to the respective predictive correction errors are set. For example, smaller predictive correction errors are set for whiter areas (brighter areas). With the currently set body motion correction parameter, the correction errors at the upper right and lower left positions on the imaging target (black arrows 10c and 10d in FIG. 4) are smaller than those at the right position (a white arrow 10e in FIG. 4) on the imaging target. An image 10b in FIG. 4 represents the relationship between predictive correction errors and display luminances. It is possible to allow the user to easily check the state of the distribution of predictive correction errors by combining and displaying the first image data and a predictive error map or displaying, side by side, the first image data and an image indicating the relationship between the values of the predictive error map and display luminances.

In step S6, it is determined whether the user has corrected the body motion correction parameter by operating the correction information input unit 6. If the user has corrected the parameter, the process advances to step S7 ("YES" in FIG. 3). If the user has not corrected the parameter, the process advances to step S8 ("NO" in FIG. 3).

The user corrects the body motion correction parameter by operating the GUI shown in FIG. 5 using a user interface (e.g., the mouse) of the correction information input unit 6. The GUI includes a slider 20a for adjusting the body motion correction parameter and an edit box 20b for directly designating a numerical value as a body motion correction parameter.

In step S7, the correction information input unit 6 corrects the body motion correction parameter based on an input from the user. The process then returns to step S4, in which the error map generating unit 3b generates a predictive error map again.

In step S8, the second imaging unit 2b corrects the motion of the imaging target based on the movement of the reference position and the body motion correction parameter. The second imaging unit 2b acquires the second image data as a corrected MR image. The movement of the reference position is detected by using navigator pulses, as described above.

As described above, the magnetic resonance imaging apparatus 1 of this embodiment generates a predictive error map by using the first image data and the body motion correction parameter which can be adjusted. The magnetic resonance imaging apparatus 1 of the embodiment then displays the first image data and the predictive error map. The user can easily predict to which degree correction is performed at each position on an imaging target using the set body motion correction parameter based on the predictive error map. This can reduce the labor of performing imaging again. The magnetic resonance imaging apparatus 1 of the embodiment can support the user to efficiently perform imaging.

Second Embodiment

Figure 6:
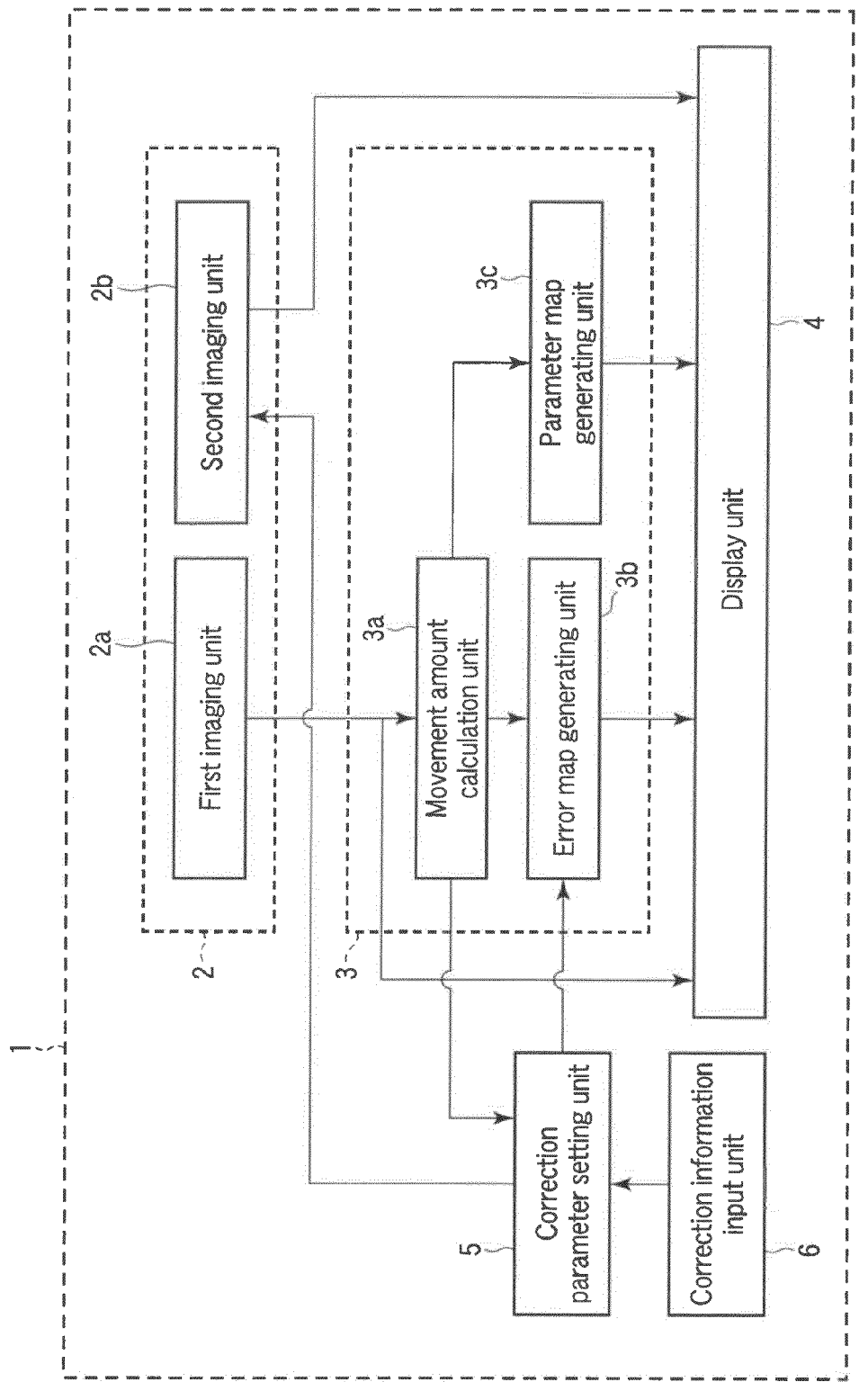
FIG. 6 is a block diagram showing a magnetic resonance imaging apparatus according to the second embodiment.

A magnetic resonance imaging apparatus 10 according to the second embodiment will be described below. FIG. 6 is a block diagram of the magnetic resonance imaging apparatus 10 according to the second embodiment. The magnetic resonance imaging apparatus 10 of this embodiment corresponds to the arrangement of the magnetic resonance imaging apparatus 1 in FIG. 1 to which a parameter map generating unit 3c is added. The parameter map generating unit 3c obtains body motion correction parameters (second correction parameters) corresponding to minimum predictive correction errors, and generates the second correction parameter map indicating the spatial distribution of second correction parameter values.

This arrangement allows the user to easily check the distribution of correction parameter values at the respective positions on an imaging target.

The blocks shown in FIG. 6 are the same as those described in the first embodiment except for the parameter map generating unit 3c, and hence a description of the blocks except for the parameter map generating unit 3c will be omitted to prevent redundancy.

The parameter map generating unit 3c calculates second correction parameters from a reference position and the movement amounts of target positions, and generates the second correction parameter map. The generated second correction parameter map is input to a display unit 4.

The operation of the magnetic resonance imaging apparatus 10 according to the second embodiment will be described with reference to the flowchart of FIG. 7.

Figure 7:
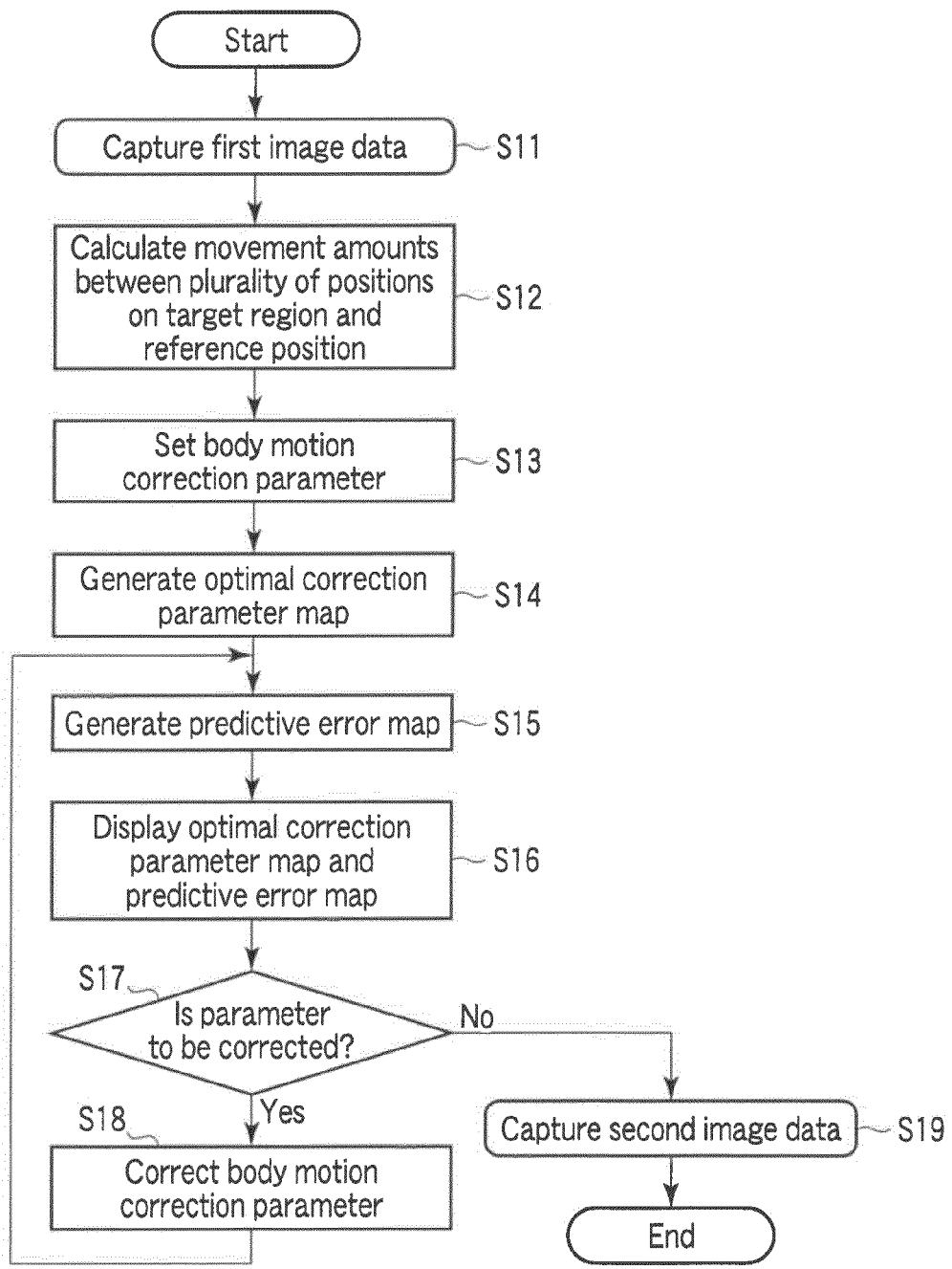
FIG. 7 is a flowchart for the magnetic resonance imaging apparatus according to the second embodiment.

Step S11 in FIG. 7 corresponds to step S1 in the first embodiment (FIG. 3). Step S12 corresponds to step S2. Step S13 corresponds to step S3. Step S15 corresponds to step S4. step S18 corresponds to step S7. Step S19 corresponds to step 8. In this embodiment, a description of these steps will be omitted to prevent redundancy.

In step S14, the parameter map generating unit 3c calculates the second correction parameter which minimizes a prediction correction error at each target position, and generates the second correction parameter map.

A method of calculating "second correction parameters" in this embodiment will be described below.

Figure 9B:
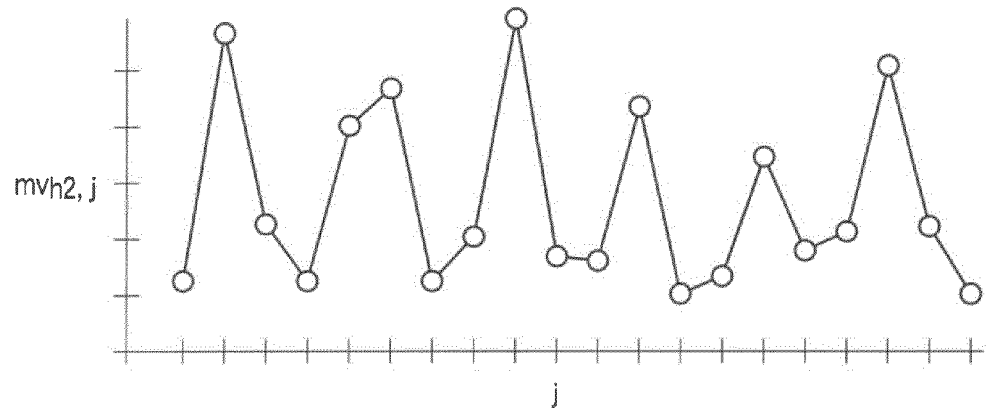
FIG. 9B is a graph showing changes in the movement amount of a target position.
Figure 9C:
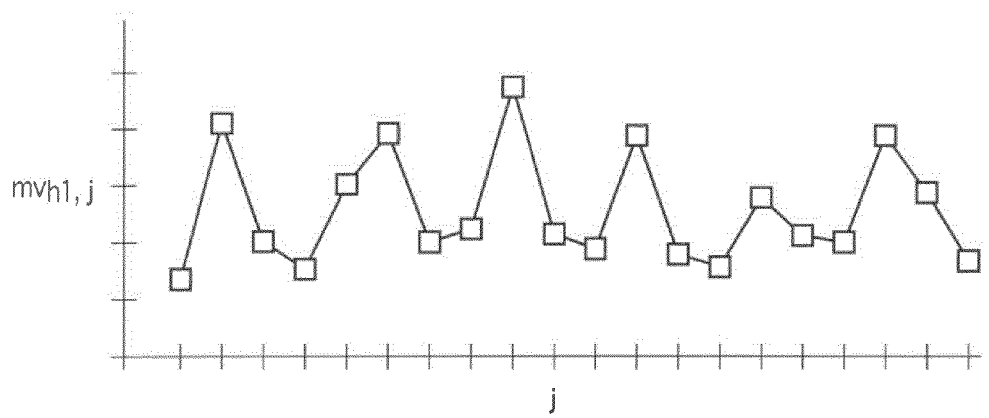
FIG. 9C is a graph showing changes in the movement amount of a target position.

FIG. 8 is a schematic view of a magnetic resonance image associated with a human chest region. FIG. 8 shows an example of the arrangement of a reference position s and target positions t1 and t2 in this embodiment. The embodiment calculates second correction parameters at the target positions t1 and t2. The graph of FIG. 9A shows a movement amount $mv_j(x_s)$ of the reference position s from the first reference frame to the jth second reference frame. The graph of FIG. 9B shows a movement amount $mv_j(x_{t1})$ of the target position t1 from the first reference frame to the jth second reference frame. The graph of FIG. 9C shows a movement amount $mv_j(x_{t2})$ of the target position t2 from the first reference frame to the jth second reference frame. The reference position s is located at a coordinate position $x_s$. The target position t1 is located at a coordinate position $x_{t1}$. The target position t2 is located at a coordinate position $x_{t2}$. The abscissa in each of FIGS. 9A, 9B, and 9C represents a number j of the second reference frame. FIG. 10 is a graph showing the relationship between the movement of a reference position and the movements of the target positions. The abscissa in FIG. 10 represents the movement amount $mv_j(x_s)$. The ordinate in FIG. 10 represents the movement amounts $mv_j(x_{t1})$ and $mv_j(x_{t2})$.

As described above, the second correction parameter is obtained for each target position so as to minimize a predictive correction error. A second correction parameter $Map_{param}(x_{t1})$ at the target position t1 is calculated by equation (3). A second correction parameter $Map_{param}(x_{t2})$ at the target position t2 is calculated by equation (4).

$$Map_{param}(x_{t1}) = \arg\min_a MAP_{err}(x_{t1}) \quad (3)$$
$$= \arg\min_a \sum_{j=1}^{N-1} (a \cdot mv_j(x_s) - mv_j(x_{t1}))^2$$

$$Map_{param}(x_{t2}) = \arg\min_a MAP_{err}(x_{t2}) \quad (4)$$
$$= \arg\min_a \sum_{j=1}^{N-1} (a \cdot mv_j(x_s) - mv_j(x_{t2}))^2$$

In this embodiment, a predictive correction error is the total sum of square errors. Therefore, the second correction parameter $Map_{param}(x_{t1})$ is expressed by the gradient of a regression line $l_{t1}$ of points plotted in FIG. 10. The second correction parameter $Map_{param}(x_{t2})$ is expressed by the gradient of a regression line $l_{t2}$ of points plotted in FIG. 10.

Equations (3) and (4) are calculated by the least squares method in the form of equations (5) and (6).

$$Map_{param}(x_{t1}) = \frac{\sum_{j=1}^{N-1} mv_j(x_s) \cdot mv_j(x_{t1})}{\sum_{j=1}^{N-1} (mv_j(x_s))^2} \quad (5)$$

$$Map_{param}(x_{t2}) = \frac{\sum_{j=1}^{N-1} mv_j(x_s) \cdot mv_j(x_{t2})}{\sum_{j=1}^{N-1} (mv_j(x_s))^2} \quad (6)$$

In this manner, the second correction parameters are calculated for all the target positions, and the second correction parameter map having the calculated values as pixel values is generated. It is also possible to add, as the pixels of a prediction error map, interpolation values based on the calculated positions and the corresponding second correction parameters as in the case of the above predictive error map.

In step S16, the display unit 4 displays the predictive error map generated by an error map generating unit 3b and the second correction parameter map generated by the parameter map generating unit 3c.

An image 30a in FIG. 11 is a composite image of the second correction parameter map and the first image data. As each pixel value of the image 30a, a value corresponding to the second correction parameter value is set. For example, pixel values are set such that as the second correction parameter increases, a whiter (brighter) area is displayed, whereas as the second correction parameter value decreases, a blacker (darker) area is displayed. In the case of the image 30a in FIG. 11, the second correction parameter at a lower position (black arrow 30c) on the imaging target in FIG. 11 is larger than the second correction parameter at an upper left position (white arrow 30d) on the imaging target in FIG. 11. In addition, an image 30b in FIG. 11 represents the relationship between a second correction parameter $Map_{param}$ and display luminance. It is possible to allow the user to easily check the state of the second correction parameters at the respective positions by combining and displaying the second correction parameter map and the first image data or displaying, side by side, the second correction parameter map and a bar (image 30b) representing the relationship between the second correction parameter values and display luminances.

If it is determined in step S17 that the user has corrected the body motion correction parameter by operating an input unit 5, the process advances to step S15 ("YES" in FIG. 7). If the user has not corrected the parameter, the process advances to step S18 ("NO" in FIG. 7).

A body motion correction parameter correction method to be used is not limited to that described in the first embodiment. For example, the user may designate a position on the second correction parameter map via the mouse of the input unit 5 as a user interface and set the second correction parameter value at the designated position as a body motion correction parameter after correction. The user may designate a position on the image 30a or on the image 30b (the bar indicating the second correction parameter values). When the user designates a position on the second correction parameter map or the image 30a, the user may designate a plurality of positions. It is also possible to use a plurality of positions included in a rectangular area or an area in an arbitrary shape which are designated on the second correction parameter map or the image 30a. It is possible to calculate the second correction parameter based on a plurality of designated positions and correct the body motion correction parameter.

For example, as indicated by equation (7), a body motion correction parameter $Map_{adj}$ is corrected by the average of the second correction parameters at a plurality of designated points $x_{t1}, x_{t2}, \ldots, x_{tM}$.

$$Map_{adj} = \frac{1}{M} \sum_{i=1}^{M} Map_{Param}(x_{ti}) \tag{7}$$

As indicated by equation (8), it is possible to recalculate and correct the body motion correction parameter $Map_{adj}$ so as to minimize a predictive correction error by using all the movement amounts calculated at a plurality of designated points.

$$\begin{aligned} Map_{adj} &= \arg\min_{a} \sum_{i=1}^{M} MAP_{err}(x_{ti}) \\ &= \arg\min_{a} \sum_{i=1}^{M} \sum_{j=1}^{N-1} (a \cdot mv_j(x_s) - mv_j(x_{ti}))^2 \\ &= \sum_{i=1}^{M} \frac{\sum_{j=1}^{N-1} mv_j(x_s) \cdot mv_j(x_{ti})}{\sum_{j=1}^{N-1} (mv_j(x_s))^2} \end{aligned} \tag{8}$$

As described above, the magnetic resonance imaging apparatus 10 of this embodiment calculates the second correction parameter for each target potion, generates the second correction parameter map, and displays the second correction parameter map. This allows the user to easily check the second correction parameter value at each position on the imaging target.

The first and second embodiments are not limited to the above embodiments and can be variously modified and embodied within the spirit and scope of the invention.

In the above embodiments, the imaging target is the heart. For example, the imaging target may be an abdominal organ such as the liver or kidney. Alternatively, a plurality of regions may be simultaneously set as imaging targets.

For the sake of a simple description, in the above embodiments, an imaging position is corrected by only performing translation in the body axis direction. However, the present invention is not limited to this. For example, it is possible to correct an imaging position by affine transform or the like in consideration of rotation and scale. In addition, a reference position is set on the diaphragm below a right lung L1. A reference position may be set on any region associated with the motion of an imaging target, e.g., a position on a diaphragm D below a left lung L2. Alternatively, a portion of an imaging target may be set as a reference position. In addition, a plurality of points may be set as reference positions instead of one point.

In general, the relationship between a set $O_s = \{d_{s1}, d_{s2}, \ldots, d_{sD}\}$ of three-dimensional vectors of movement amounts at reference positions and a three-dimensional vector $d_c(X)$ of a correction amount at a spatial position X on an imaging target is represented by $$d_c(X) = F(X, O_a, O_s) \tag{9}$$

In equation (9), the set $O_a$ is a set $\{a_1, a_2, \ldots, a_A\}$ of body motion correction parameters. The function F determines a correction amount based on a spatial position on an imaging target, the movement amount of a reference position, and a body motion correction parameter.

Assume that reference positions s1 and s2 are arranged as shown in FIG. 12, and a correction coefficient $a_1$ for translation in the y direction, a correction coefficient $a_2$ for translation in the x direction, and a coefficient $a_3$ for a scale in the y direction are used as body motion correction parameters. In this case, the relationship between a three-dimensional vector $d_c$ of a correction amount and movement amounts $d_{s1}$ and $d_{s2}$ of reference positions is represented by $$\begin{pmatrix} d_{c,x} \\ d_{c,y} \\ c_{c,z} \end{pmatrix} = \begin{pmatrix} 0 & 0 & 0 \\ 0 & a_3 & 0 \\ 0 & 0 & 0 \end{pmatrix} \begin{pmatrix} x \\ y \\ z \end{pmatrix} + \begin{pmatrix} a_2 \cdot d_{s2,y} \\ a_1 \cdot d_{s1,y} \\ 0 \end{pmatrix} \tag{10}$$

At this time, equation (11) represents a predictive correction error at a target position $x_t$ in the first image data.

$$MAP_{err}(x_t) = \sum_{j=1}^{N-1} (d'_{c,j}(x_t) - mv_j(x_t))^T (d'_{c,j}(x_t) - mv_j(x_t)) \tag{11}$$

A predictive correction amount vector $d'_{c,j}(x_t)$ is a predictive correction amount vector at the target position $x_t$, which is calculated from the first reference frame and the jth second reference frame. A movement amount vector $mv_j(x_t)$ is a movement amount vector at the target position $x_t$.

Equations (12) represent the second correction parameters at the target position $x_t$ in the first image data.

$$\begin{aligned} Map_{param-a1}(x_t) &= \arg\min_{a_1} MAP_{err}(x_t) \\ Map_{param-a2}(x_t) &= \arg\min_{a_2} MAP_{err}(x_t) \\ &\vdots \\ Map_{param-aA}(x_t) &= \arg\min_{a_A} MAP_{err}(x_t) \end{aligned} \tag{12}$$

As indicated by equation (12), if there are a plurality of body motion correction parameters, it is necessary to obtain the second correction parameter for each parameter.

In the above embodiments, the motion of an imaging target is corrected by directly correcting an imaging position. However, the present invention is not limited to this. It is possible to correct the motion of an imaging target by acquiring an MR signal and the position information of a reference position while fixing an imaging position, storing the acquired MR signal and the position information of the reference position as a combination in advance, and correcting the acquired MR signal before imaging by reconstruction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a first imaging unit configured to capture a plurality of first image data including a first reference frame and a second reference frame, the frames each including a reference position and a target region in an object;
a movement amount calculation unit configured to calculate a movement amount of a local position between the first reference frame and the second reference frame, the local position including the reference position and the target region;
a correction parameter setting unit configured to set a first correction parameter for correcting body motion of the object, based on the movement amount;
an error map generating unit configured to generate a predictive error map including a pixel value corresponding to a predictive correction error,
wherein the predictive correction error is obtained from a predictive position and a predictive correction position, and
wherein the predictive position is a position based on the movement amount and the predictive correction position is a position based on the first correction parameter; and
a display unit which displays the predictive error map and the first image data.

2. The apparatus according to claim 1, further comprising a parameter map generating unit configured to generate a parameter map including a pixel value corresponding to a second correction parameter, wherein the second correction parameter is obtained based on the movement amount, which minimizes the predictive correction error, and
wherein the display unit displays the parameter map in addition to the predictive error map and the first image data.

3. The apparatus according to claim 2, further comprising a correction information input unit configured to input correction information for the first correction parameter, and
wherein the correction parameter setting unit corrects the first correction parameter in accordance with the information input from the correction information input unit.

4. The apparatus according to claim 3, wherein the correction information is information indicating a position on the parameter map, and
the correction parameter setting unit corrects the first correction parameter by using the second correction parameter at the position on the parameter map.

5. The apparatus according to claim 4, wherein the error map generating unit updates the predictive error map when the first correction parameter is corrected, and
the display unit displays the updated predictive error map.

6. The apparatus according to claim 5, further comprising a second imaging unit configured to capture second image data upon correcting body motion based on a body motion monitor signal for detecting body motion and the first correction parameter, and
wherein the display unit further displays the second image data.

7. The apparatus according to claim 6, wherein the first correction parameter and the second correction parameter are parameters which characterize transform that deforms an imaging space based on a movement amount of the reference position.

8. The apparatus according to claim 7, wherein the display unit displays an image obtained by combining the first image data and at least one of the predictive error map and the parameter map.

* * * * *